United States Patent
Ceravalo

(10) Patent No.: US 10,075,012 B2
(45) Date of Patent: Sep. 11, 2018

(54) REMOTE POWER CONTROL AND MONITORING OF A VEHICLE POWER SYSTEM

(71) Applicant: DAS Companies, Inc., Palmyra, PA (US)

(72) Inventor: Joseph William Ceravalo, Annville, PA (US)

(73) Assignee: DAS Companies, Inc., Palmyra, PA (US)

( * ) Notice: Subject to any disclaimer, the term of this patent is extended or adjusted under 35 U.S.C. 154(b) by 0 days.

(21) Appl. No.: 15/120,635

(22) PCT Filed: Feb. 24, 2016

(86) PCT No.: PCT/US2016/019299
§ 371 (c)(1),
(2) Date: Aug. 22, 2016

(87) PCT Pub. No.: WO2016/138100
PCT Pub. Date: Sep. 1, 2016

(65) Prior Publication Data
US 2017/0063146 A1 Mar. 2, 2017

Related U.S. Application Data

(60) Provisional application No. 62/120,004, filed on Feb. 24, 2015.

(51) Int. Cl.
| | |
|---|---|
| *H02J 7/14* | (2006.01) |
| *H02J 5/00* | (2016.01) |
| *B60R 16/03* | (2006.01) |
| *G01R 31/40* | (2014.01) |
| *H02M 7/00* | (2006.01) |
| *G01R 31/36* | (2006.01) |

(Continued)

(52) U.S. Cl.
CPC ............ *H02J 7/1461* (2013.01); *B60R 16/03* (2013.01); *G01R 31/40* (2013.01); *H02J 5/00* (2013.01); *H02M 7/003* (2013.01); *G01R 1/025* (2013.01); *G01R 31/362* (2013.01); *G01R 31/42* (2013.01)

(58) Field of Classification Search
CPC ............ B60R 16/03; H02J 5/00; H02J 7/1461; G01R 31/40; G01R 31/362; G01R 31/42; G01R 1/025; H02M 7/003
See application file for complete search history.

(56) References Cited

U.S. PATENT DOCUMENTS

| | | | |
|---|---|---|---|
| 7,952,236 B2 * | 5/2011 | Mitsutani | B60L 3/12 307/10.1 |
| 2005/0030197 A1 | 2/2005 | Greenacre et al. | |

(Continued)

FOREIGN PATENT DOCUMENTS

| | | |
|---|---|---|
| KR | 10-2003-0094806 A | 12/2003 |
| WO | 2014-090884 A1 | 6/2014 |

OTHER PUBLICATIONS http://web.archive.org/web/20101212190628/http://calculator.net/voltage-drop-calculator.html.*

(Continued)

*Primary Examiner* — Daniel Kessie

(57) ABSTRACT

A power inverter (12) that is connectable with a mobile application via a wireless communication link (32). The mobile application enables operation of the power inverter (12) to be monitored and controlled via a graphical user interface on a remote device (34).

17 Claims, 17 Drawing Sheets

(51) Int. Cl.
G01R 31/42 (2006.01)
G01R 1/02 (2006.01)

(56) References Cited

U.S. PATENT DOCUMENTS

| | | | |
|---|---|---|---|
| 2007/0091575 A1* | 4/2007 | Hussaini | H02J 7/0042 |
| | | | 361/715 |
| 2010/0315850 A1* | 12/2010 | J'Neva Devi | H02M 7/493 |
| | | | 363/95 |
| 2011/0090726 A1* | 4/2011 | Brotto | H02J 7/0065 |
| | | | 363/131 |
| 2011/0095600 A1 | 4/2011 | Sayed et al. | |
| 2014/0062686 A1 | 3/2014 | Florio | |

OTHER PUBLICATIONS

Korean International Search Report and Written Opinion of the International Searching Authority, dated May 27, 2016, for PCT/US2016/019299.

\* cited by examiner

REMOTE POWER CONTROL AND MONITORING OF A VEHICLE POWER SYSTEM

BACKGROUND

Portable power inverter devices provide a source of alternating current (AC) power from a direct current (DC) power source. For example, portable power inverters might commonly be used in vehicles to generate AC power to operate AC devices, such as home appliances, with the vehicle battery as the DC power source to the inverter. For example, a portable power inverter might be attached directly to the vehicle battery via cables, or might be connected to the vehicle battery via an auxiliary power port or cigarette lighter adapter within the vehicle. An example of a similar power inverter is described in U.S. Pat. No. 7,272,008.

However, current portable power inverters do not allow a user of the power inverter to remotely set operating parameters of the inverter, or to remotely monitor the operating conditions of the inverter. Further, current power inverters do not allow users to monitor the status and functionality of the power source (e.g., the vehicle battery and/or vehicle alternator).

From the foregoing, it is appreciated that there exists a need for power inverters that are aimed to ameliorate the shortcomings of existing devices.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

DETAILED DESCRIPTION

Figure 1:
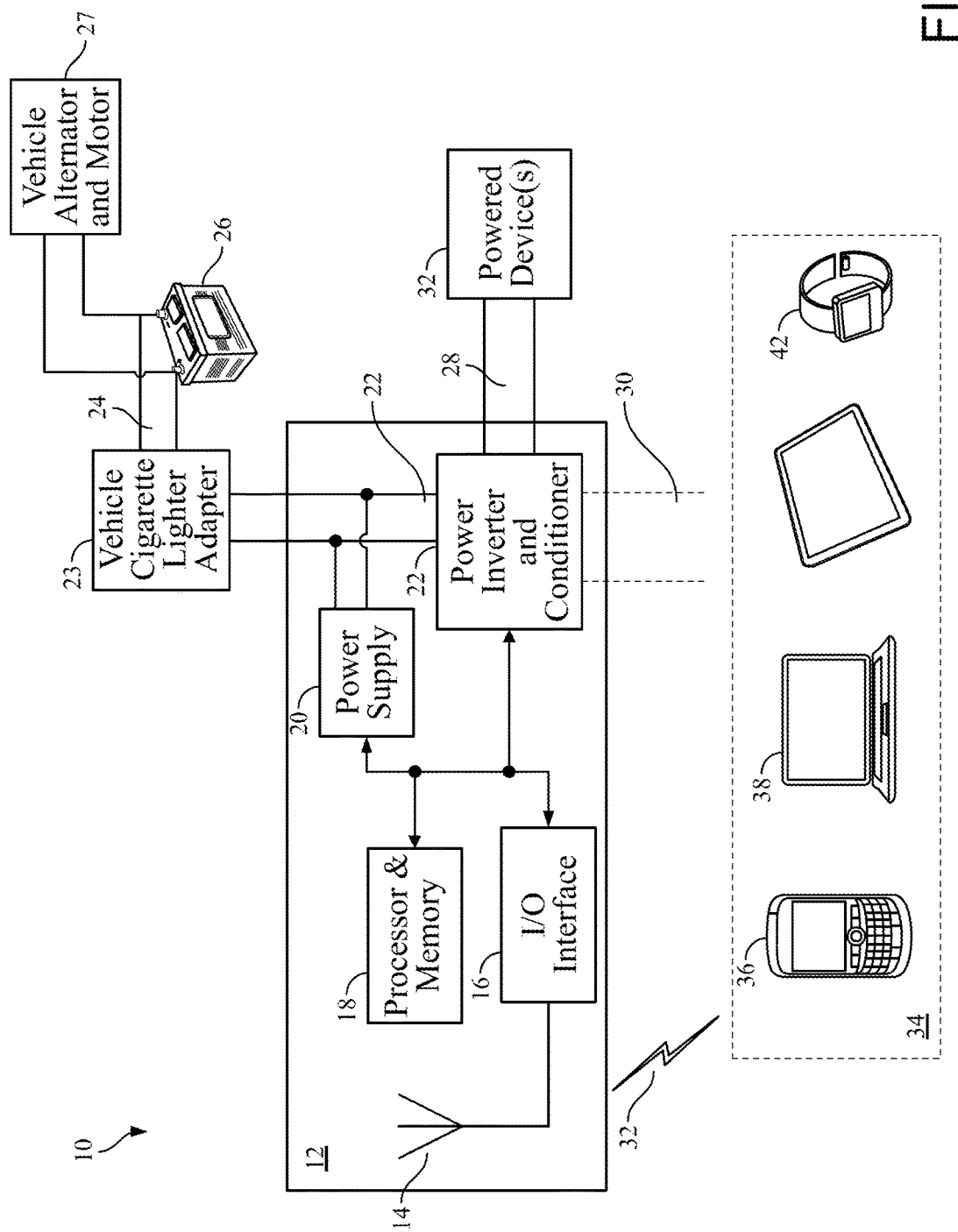
FIG. 1 is a block diagram of an exemplary remote vehicle power control and monitoring system in accordance with described embodiments.

The ensuing detailed description provides preferred exemplary embodiments only, and is not intended to limit the scope, applicability, or configuration of the claims. Rather, the ensuing detailed description of the preferred exemplary embodiments will provide those skilled in the art with an enabling description for implementing the claims. Various changes may be made in the function and arrangement of elements without departing from the spirit and scope of the claims.

In the figures, elements that are similar to those of other embodiments of the present invention are represented by reference numerals increased by a value of 100. Such elements should be regarded as having the same function and features unless otherwise stated or depicted herein, and the discussion of such elements may therefore not be repeated for multiple embodiments. In addition, reference numerals that are introduced in the specification in association with a drawing figure may be repeated in one or more subsequent figures without additional description in the specification in order to provide context for other features.

Described embodiments provide a portable power inverter for generating alternating current (AC) power from a direct current (DC) power source. The power inverter includes a removably attachable input in electrical communication with the DC power source and an output configured to provide power to external devices. An inverter converts the input DC power to AC power and provides the AC power to at least one of the outputs. A measurement unit detects operating conditions of the power inverter and a communication link transmits the detected operating conditions to a remote device. A controller in electrical communication with the measurement unit, the communication link, and the inverter, controls operation of the portable power inverter.

FIG. 1 shows exemplary vehicle power control and monitoring system 10. As shown in FIG. 1, power inverter 12 is coupled to vehicle battery 26 via cables 24. Power inverter 12 includes power inverter and conditioner 22, which generates an alternating current (AC) waveform (e.g., a square wave, a sine wave or a modified sine wave) to power one or more devices, 34, that are coupled to power inverter 12 via cables 28. Additionally, power inverter and conditioner 22 might optionally provide a pass-through DC power output, indicated by dashed lines 30. Power inverter 12 also includes processor and memory 18, input/output (I/O) interface 16, and antenna 14. In some embodiments, antenna 14 might be replaced by, or employed in addition to, a wired communication port (not shown). Processor and memory 18 and I/O interface 16 are powered by power supply 20, which receives input power from vehicle battery 26. Typically, vehicle battery 26 might be a 12V DC lead acid battery, although any battery chemistry and voltage might be employed. Processor and memory 18 store and operate upon computer readable instructions to cause vehicle power control and monitoring system 10 to operate as described herein. In described embodiments, processor and memory 18 is implemented by one or more microprocessors and memories. For example, processor and memory 18 might include one or more embedded microprocessors, digital signal processors, application specific integrated circuits (ASICs) or field programmable gate arrays (FPGAs). Further, processor and memory 18 might include one or more random access memory (RAM) chips and/or read only memory (ROM) chips, such as electrically erasable and programmable read only memory (EEPROM) or Flash memory.

I/O interface 16 might include one or more wired or wireless transceivers for communicating with devices external to power inverter 12. For example, as shown in FIG. 1, I/O interface 16 might include one or more wired or wireless transceivers to transmit and receive signals, via antenna 14 and communication link 32, to and from one or more remote devices 34 from which a user might interact with or control power inverter 12. For example, a user might install a program or application to allow remote devices 34 to communicate with and control power inverter 12. As shown in FIG. 1, remote devices 34 might include smart phone 36, laptop computer 38, tablet device 40, or wearable device 42. Therefore, I/O interface 16 might be configured to communicate via one or more fixed-wire or wireless network, such as a Local Area Network (LAN), a Wireless Local Area Network (WLAN), a Wide Area Network (WAN), a Personal Area Network (PAN), a Wireless Personal Area Network (WPAN), a telephony network such as a cellular network or a circuit switched network, an intranet, extranet, peer-to-peer network, virtual private network (VPN), the Internet, or other communications network/link. For example, communication link 32 might include one or more custom-designed communication links, and/or one or more links conforming to a standard communication protocol such as, for example, a cell relay asynchronous transfer mode (ATM) link, a packet switched (X.25, Frame-Relay) link, a circuit switched link such as a Point-to-Point Protocol (PPP) or Integrated Services Digital Network (ISDN) link, a Small Computer System Interface (SCSI) protocol link, a Serial Attached SCSI (SAS) protocol link, a Serial Advanced Technology Attachment (SATA) protocol link, a Fibre Channel (FC) link, a Peripheral Component Interconnect Express (PCI-E) link, a Serial Rapid I/O (SRIO) link, a Universal Flash Storage (UFS) link, an Infrared Data Association (IrDA) link, a Z-Wave link, a Zigbee link, a Universal Serial Bus (USB), a Wireless USB, an Ethernet link, an IEEE 802.11 (WiFi) link, an IEEE 802.15 (Bluetooth®) link, an IEEE 802.16 (WiMAX) link, an IEEE 802.22 (Whitespace) link, or a cellular link such as Long Term Evolution (LTE), High-Speed Packet Access (HSPA), Universal Mobile Telecommunications System (UMTS), Global System for Mobile communications (GSM), Enhanced Data rates for GSM Evolution (EDGE), or General Packet Radio Service (GPRS), or any other suitable communications link. Where communication link 32 is the Internet, for example, data might be communicated to and from power inverter 12 via any of a number of known protocols, such as, hypertext transfer protocol (HTTP), file transfer protocol (FTP), simple object access protocol (SOAP), wireless application protocol (WAP), secured socket layer (SSL), or any other suitable protocol. In a preferred embodiment, power inverter 12 might be in communication with remote device 34 via a wireless personal area network (WPAN), for example, an IEEE 802.15 PAN such as a Bluetooth® network.

Additionally, in some embodiments of power inverter 12, I/O interface 16 might include, or be in communication with, one or more sensors to determine operating conditions of power inverter 12. For example, I/O interface 16 might include a temperature sensor to monitor the temperature within the case of power inverter 12 to determine if power inverter 12 might be operating in an unsafe overheated and/or overloaded condition. I/O interface 16 might also include other environmental sensors, for example a humidity sensor to determine if power inverter 12 might be operating in an unsafe wet environment. I/O interface 16 might also include, or be in communication with, voltage sensors that detect the input voltage from vehicle battery 26, voltage sensors that detect the output voltage of power inverter and conditioner 22, current sensors that detect the input current from vehicle battery 26, and current sensors that detect the output current of power inverter and conditioner 22.

Figure 2:
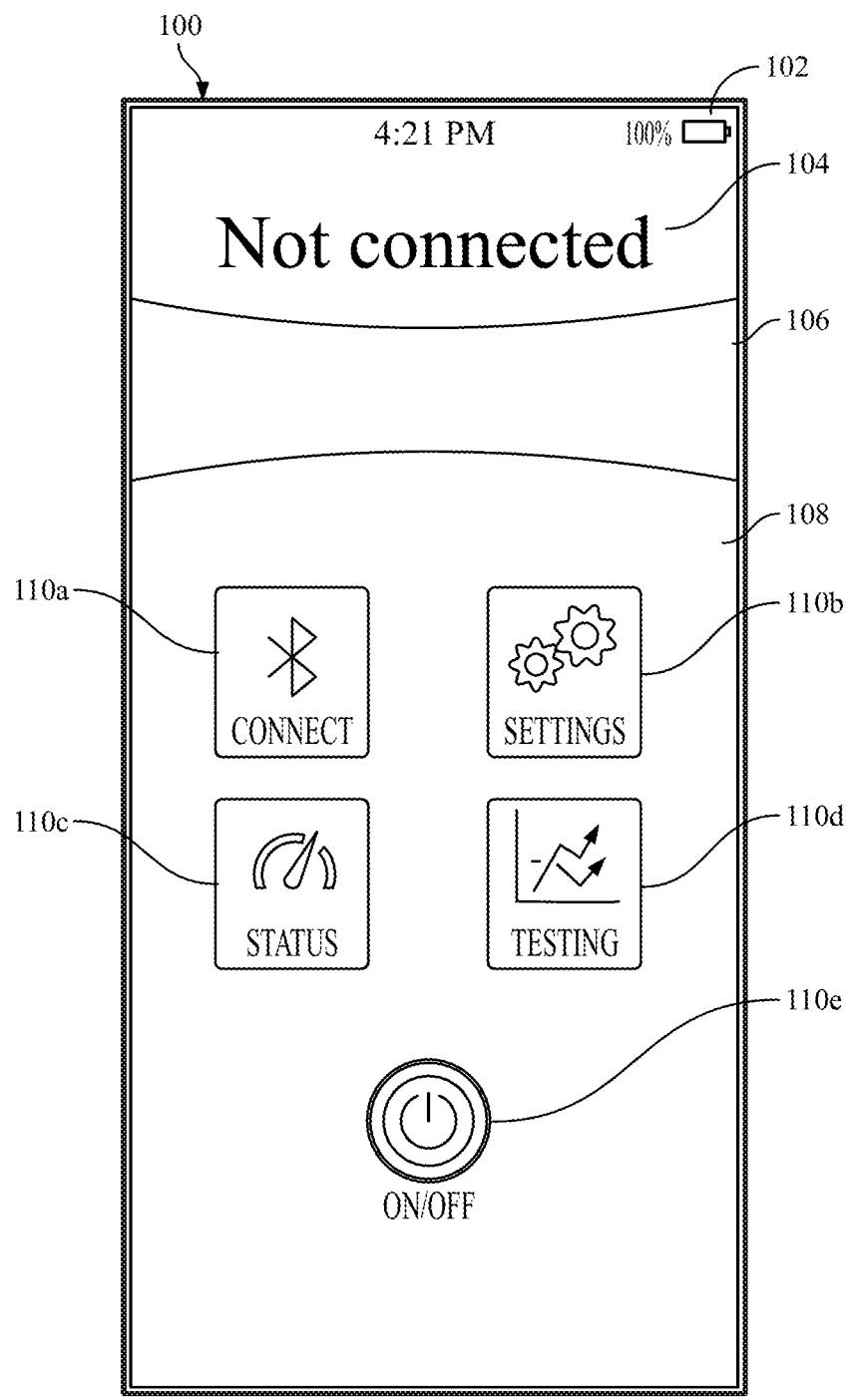
FIGS. 2-11 are exemplary user screens of a remote vehicle power control and monitoring software application in accordance with described embodiments.

FIGS. 2-11 show exemplary user screens 100 of a remote vehicle power control and monitoring software application that might be employed on remote devices 34 to interact with and control power inverter 12. For example, FIG. 2 shows an exemplary initial menu screen of the application. As shown in FIG. 2, the initial menu screen includes a system status bar 102, a power inverter status bar 104, a graphic area 106, and menu area 108, which includes one or more submenu buttons 110a-e. As shown, each submenu button 110a-e might correspond to entering a unique submenu, such as to connect to one or more power inverters 12 (e.g., submenu button 110a), to adjust the operating parameters of one or more connected power inverters 12 (e.g., submenu button 110b), to view the operating status of one or more connected power inverters 12 or the vehicle battery 26 (e.g., submenu button 110c), to perform testing on the vehicle battery and/or vehicle alternator (e.g., submenu button 110d), or to turn on or turn off one or more connected power inverters 12 (e.g., submenu button 110e).

Figure 3:
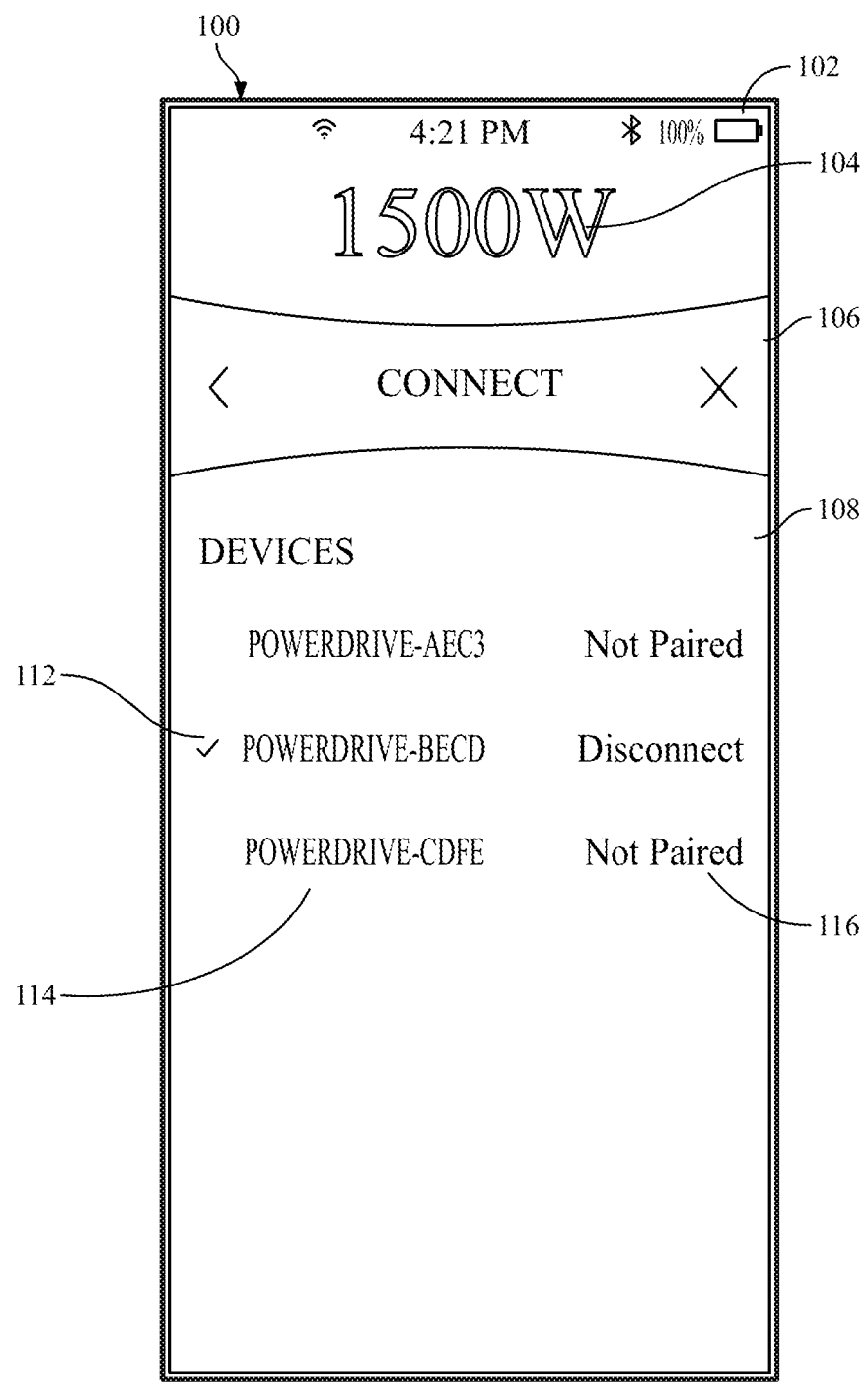

FIG. 3 shows an exemplary connection menu screen of the application. As shown in FIG. 3, when in communication with a power inverter, power inverter status bar 104 might indicate a power rating (e.g., 1500 W) or model number of the connected power inverter. Graphic area 106 might indicate the name of the screen that is being displayed (e.g., connect), and menu area 108 might include a list of any power inverters previously associated with the application and/or currently in communication with the application, as indicated by device list 114, status list 116 and selection indicator 112.

Figure 4:
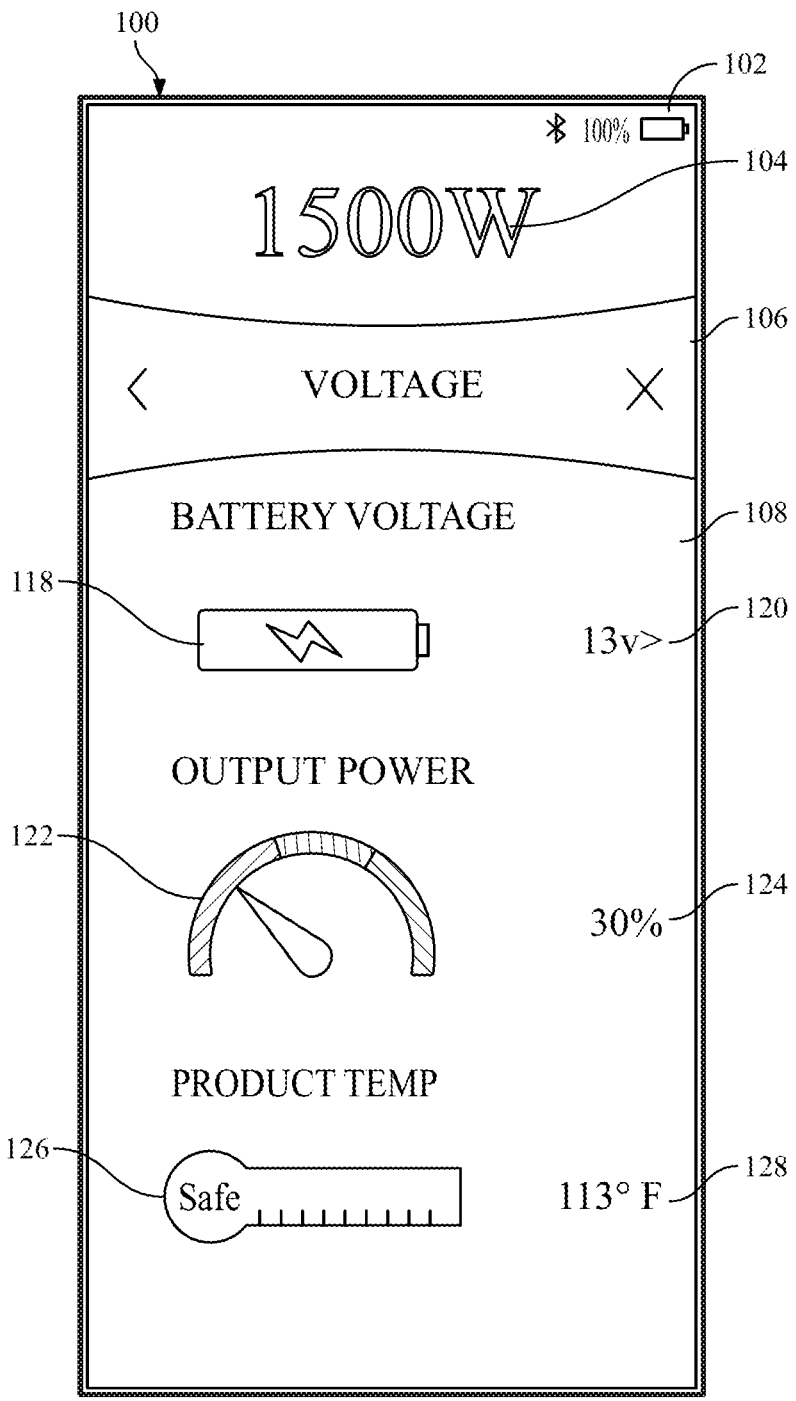

FIG. 4 shows an exemplary system status menu screen of the application. As shown in FIG. 4, the application might display within menu area 108 the battery voltage (e.g., graphically, as battery graphic 118, and/or numerically, as battery voltage indicator 120) of the selected power inverter that is in communication with the application. Similarly, the output power level of the selected power inverter might be displayed (e.g., graphically, as power gauge graphic 122, and numerically, as a percentage, as power output indicator 124). Also, the temperature within the case of the selected power inverter might be displayed (e.g., graphically, as thermometer graphic 126, and numerically, as temperature indicator 128).

Figure 5:
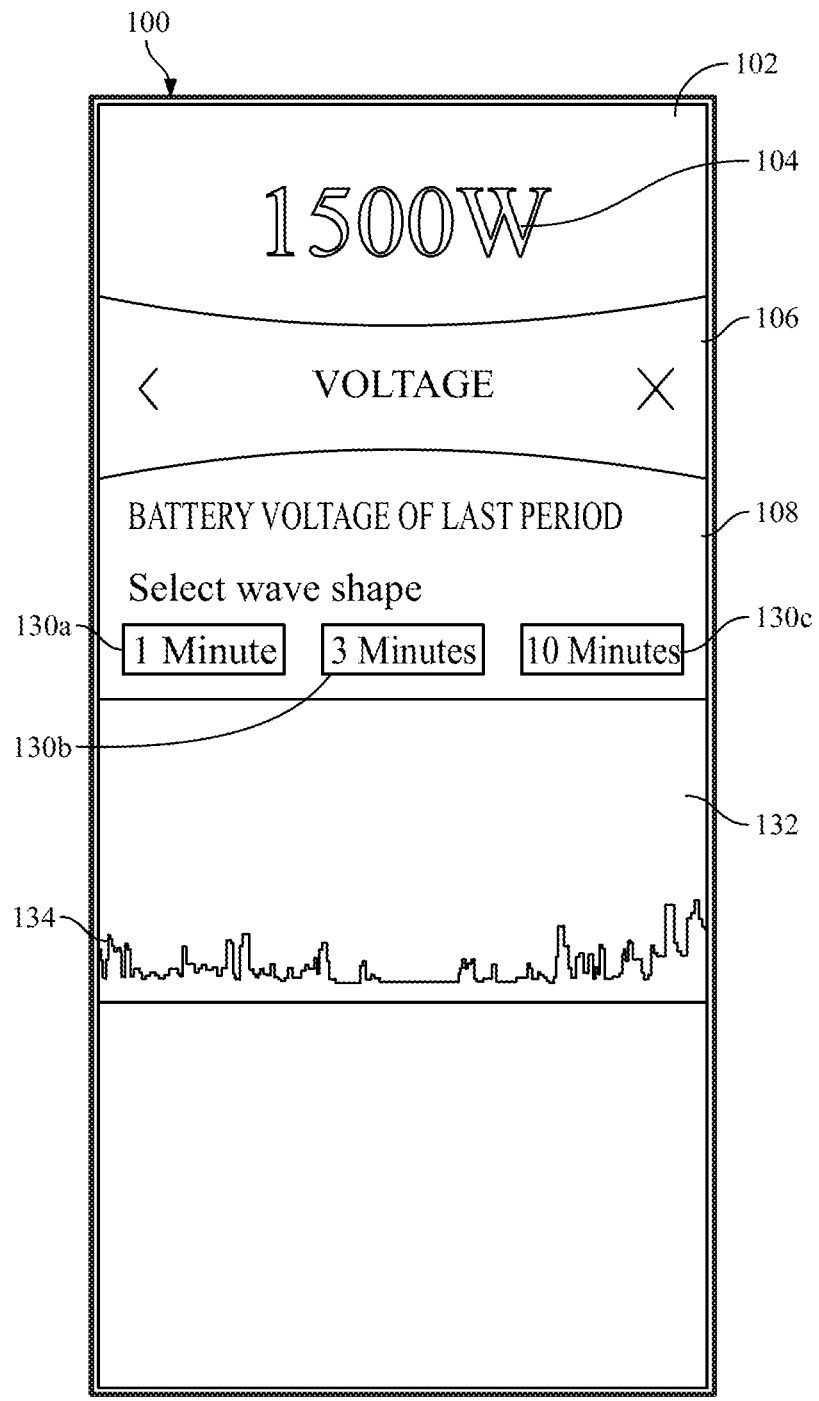

FIG. 5 shows an exemplary vehicle battery voltage graphic menu screen of the application. As shown in FIG. 5, menu area 108 might display a waveform graphic 132 displaying the voltage waveform 134 of vehicle battery 26 over a selected timeframe. For example, the display timeframe might be determined based on selection buttons 130a-c.

Figure 6:
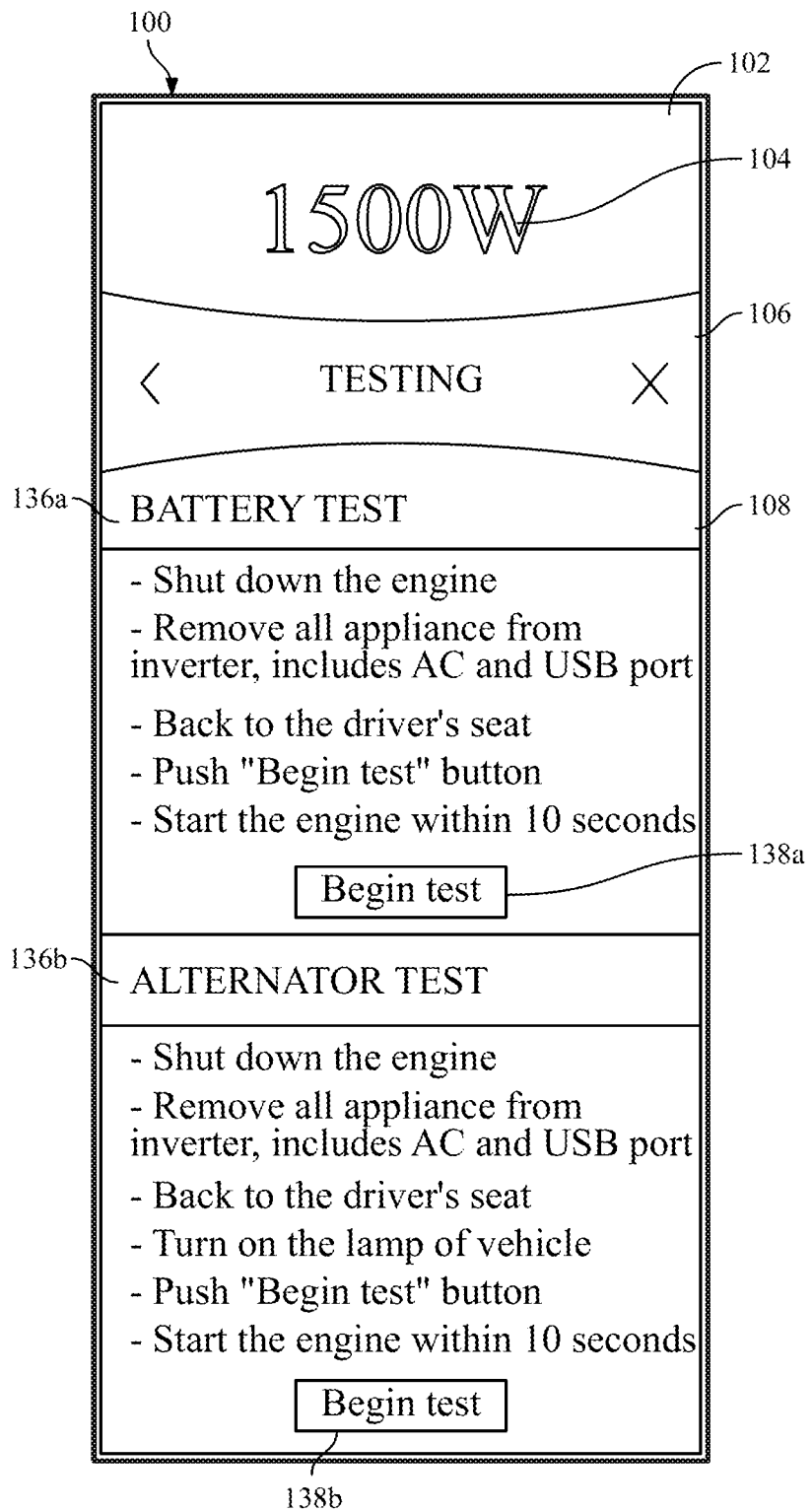

FIG. 6 shows an exemplary test mode menu screen of the application. As shown in FIG. 6, menu area 108 might display a vehicle battery test mode 136a and a vehicle alternator test mode 136b. Each test mode might indicate one or more preliminary steps for the user to perform before beginning the respective test by pressing test start buttons 138a or 138b.

Figure 7:
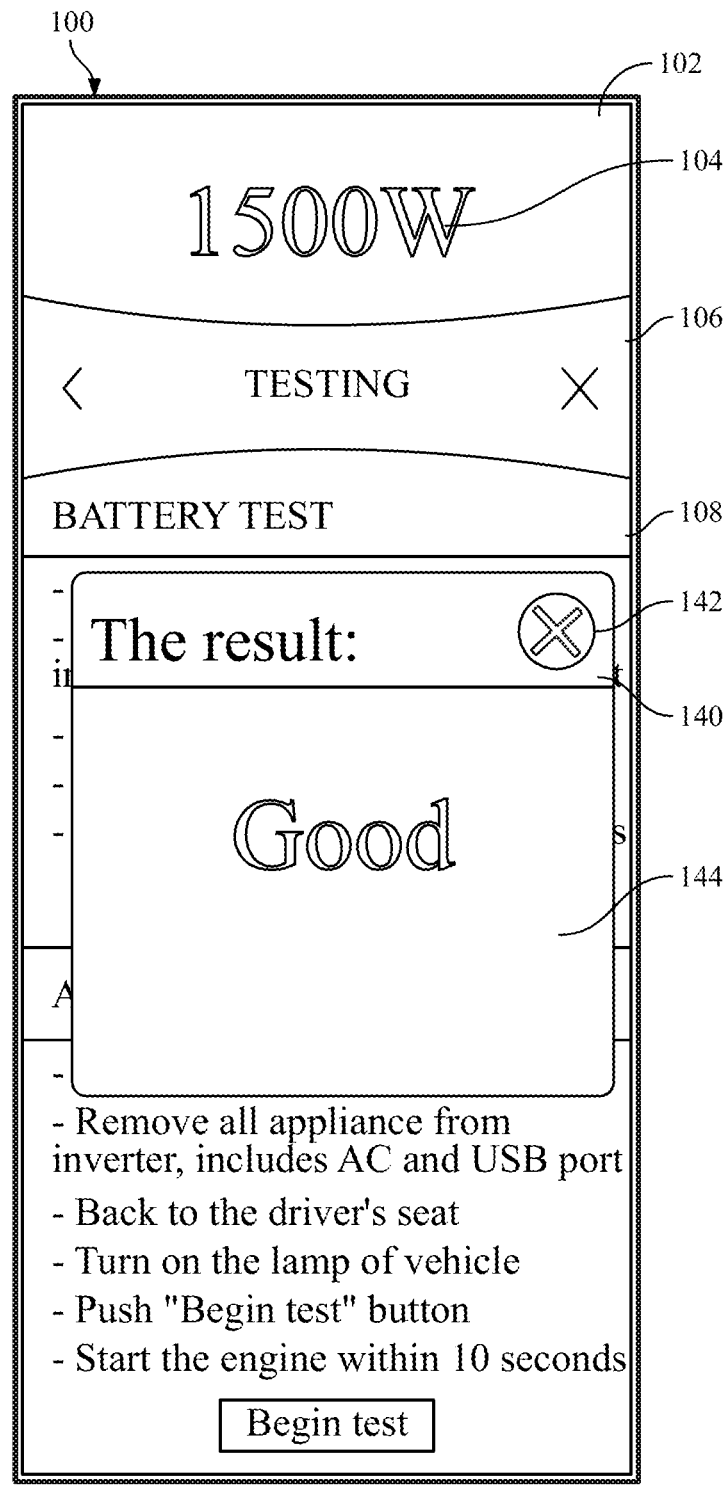

FIG. 7 shows an exemplary test result screen of the application. As shown in FIG. 7, upon completing a test mode, the application might display the test results in a popup window 140 having a results display area 144 and a close button 142.

Figure 8:
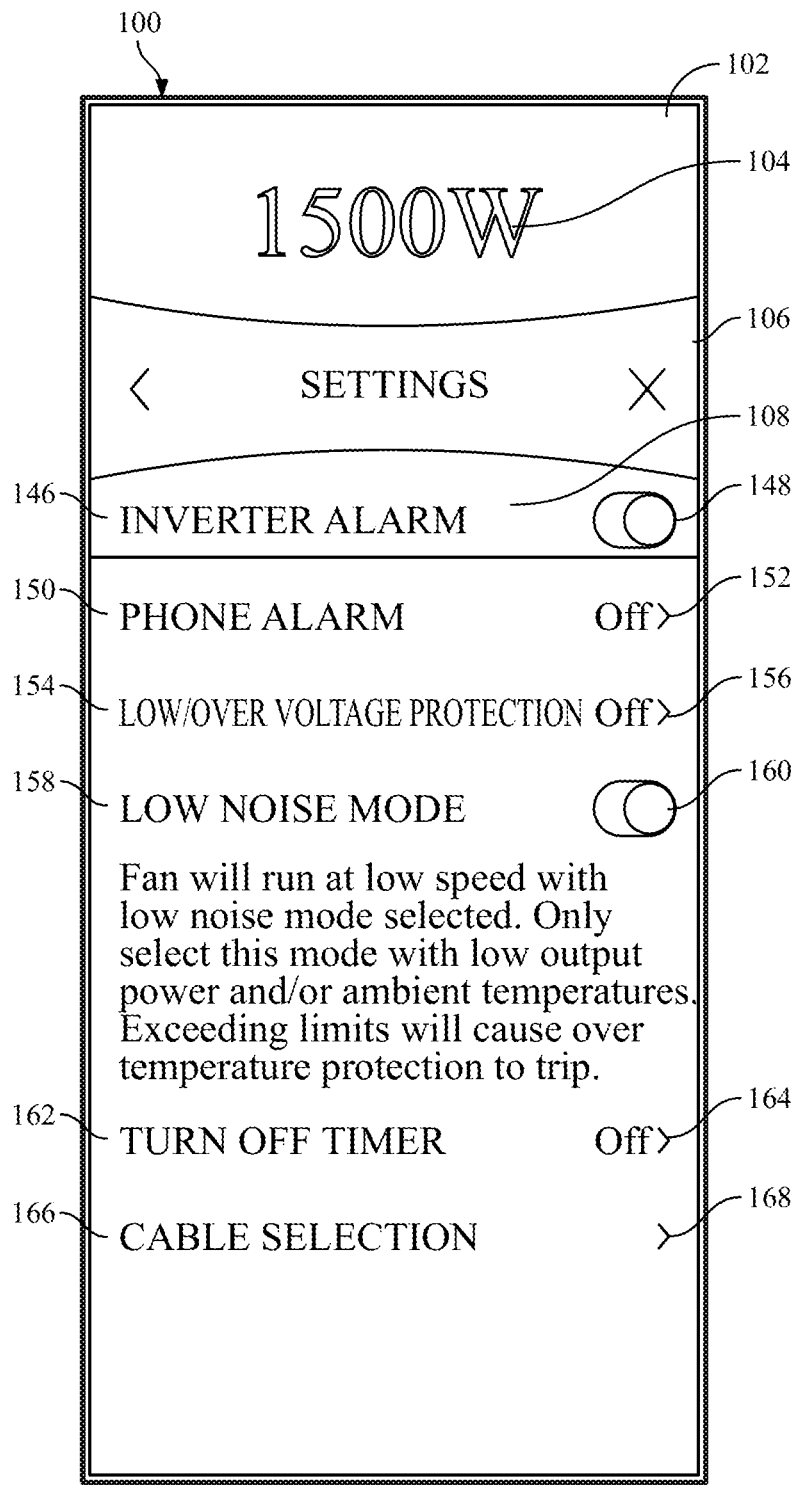

FIG. 8 shows an exemplary power inverter settings menu screen of the application. As shown in FIG. 8, menu area 108 might display submenu headings for one or more settings of power inverter 12, for example as indicated by menu headings 146, 150, 154, 158, 162 and 166. For example, as shown in FIG. 8, menu heading 146 might indicate that the user can change settings for an audible and/or visual alarm of power inverter 12, for example in the event of an over temperature condition, over voltage condition, over current condition, vehicle battery discharge condition, or other failure condition. As shown, the user might enable or disable the alarm by toggle switch 148. Similarly, menu heading 150 might indicate that the user can change settings for an audible, visual and/or vibrating alarm of one or more corresponding remote devices 34 (shown as "phone alarm") by pressing menu selector 152. Menu heading 158 indicates that the user might be able to enter into a "low noise" mode of operation of power inverter 12 in certain situations, for example, in the case where power consumption of devices connected to power inverter 12 is below a threshold (or the operating temperature of power inverter 12 is below a threshold), a cooling fan of the power inverter might be able to be turned off by toggling switch 160. Menu heading 162 indicates that the user might be able to enable one or more automatic timers to turn on or turn off particular power output ports of power inverter 12 based on elapsed time or time of day by pressing menu selector 164. Menu heading 166 indicates that the user can enter into a cable gauge calculation mode to determine the gauge of cable needed for the desired output power levels and distances, such as described in regard to FIG. 10. Menu heading 154 shows that the user might be able to enter into a menu to adjust the thresholds at which the various failure condition alarms might be activated by pressing menu selector 156.

Figure 9:
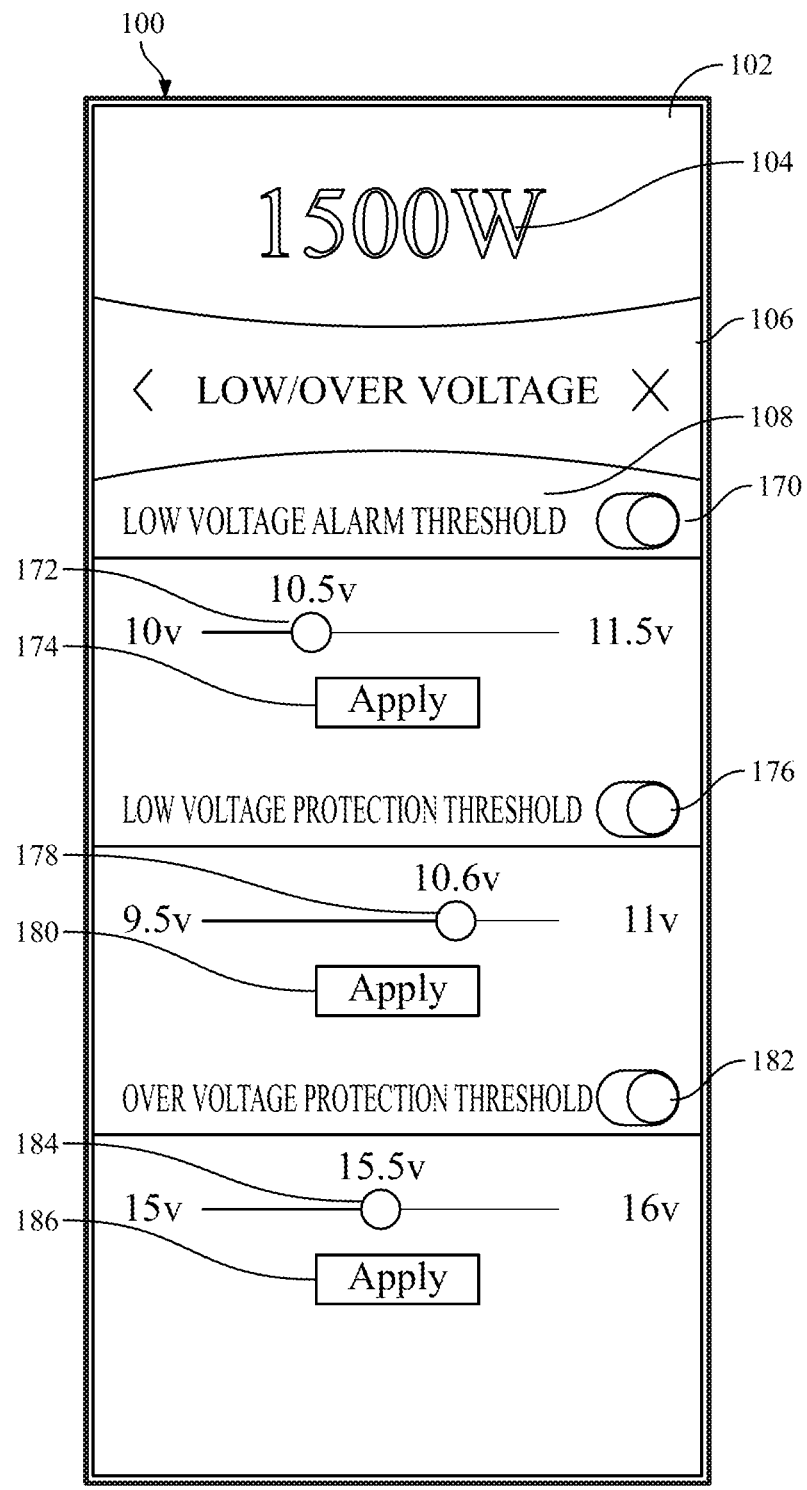

FIG. 9 shows an exemplary failure condition threshold setting menu screen of the application. As shown in FIG. 9, menu area 108 might display one or more threshold levels for various failure conditions of power inverter 12. For example, if the input voltage to power inverter 12 from vehicle battery 26 becomes too low, power inverter 12 might no longer function properly, and if the battery voltage becomes low enough, the vehicle engine might not start. As indicated by toggle switch 170, slider 172 and apply button 174, the user might be able to set their own threshold level for a low input voltage condition at which point power inverter 12 provides a notification to the user about the condition. As described herein, notifications might be audible or visual alarms provided by power inverter 12 itself, and/or audible, visual or vibrating alarms provided by one or more remote devices 34 that are in communication with power inverter 12. Similarly, toggle switch 176, slider 178 and apply button 180 set a low voltage protection threshold at which power inverter 12 operates in a reduced output power or disabled output condition. Toggle switch 182, slider 184 and apply button 186 might be employed to allow the user to set an over voltage condition at which point power inverter 12 provides a notification to the user about the condition, operates in a reduced output power or disabled output condition, or a combination thereof.

Figure 10:
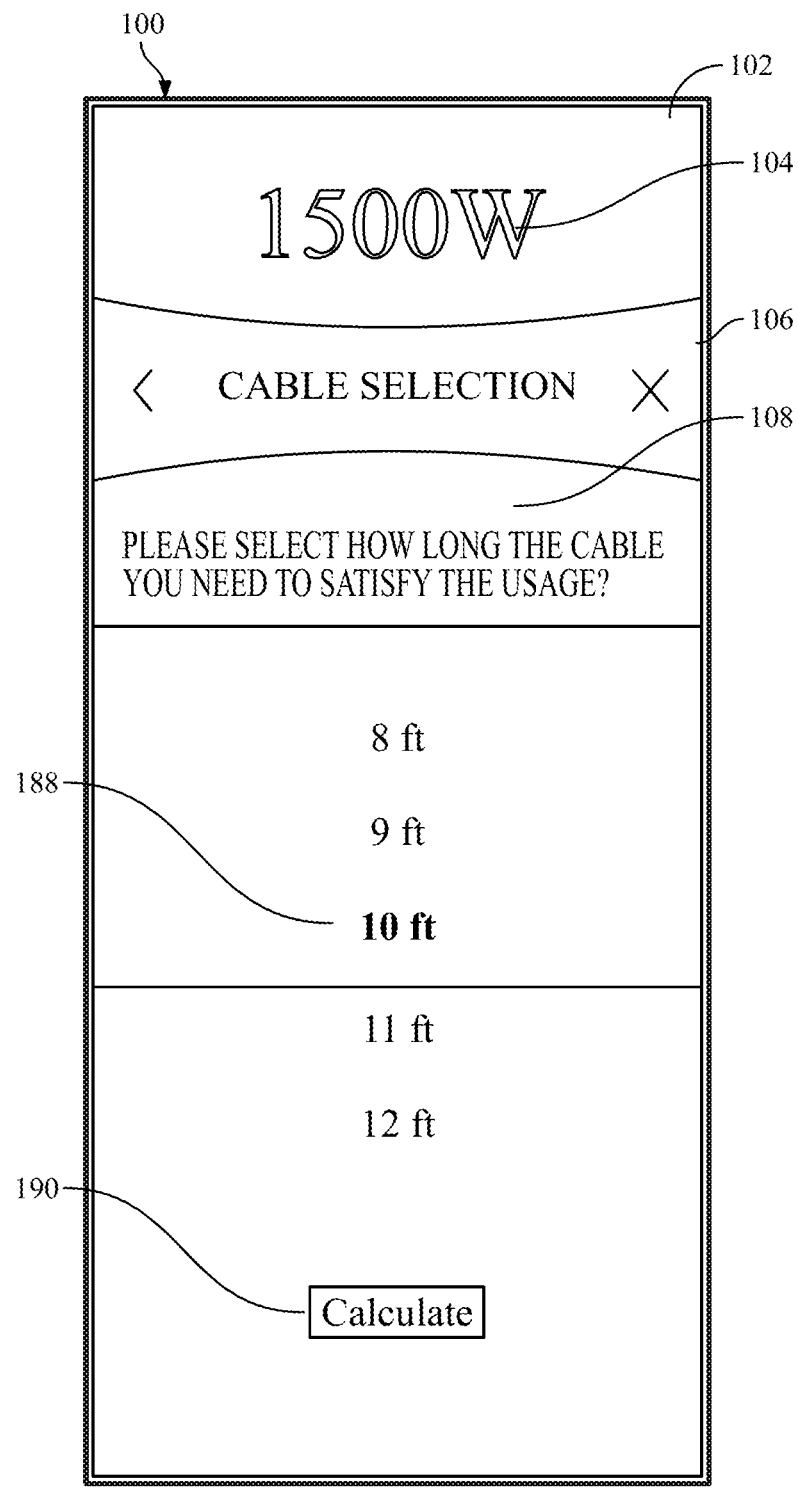

FIG. 10 shows an exemplary cable gauge calculation screen of the application. As shown in FIG. 10, the user selects a distance between power inverter 12 and each device to be powered (e.g., 32). The application might also request other information about the connected device, such as a power rating or current rating of the connected device. Based on the supplied information, the application estimates an appropriate wire gauge to use for the required distance, power and voltage drop threshold.

Figure 11:
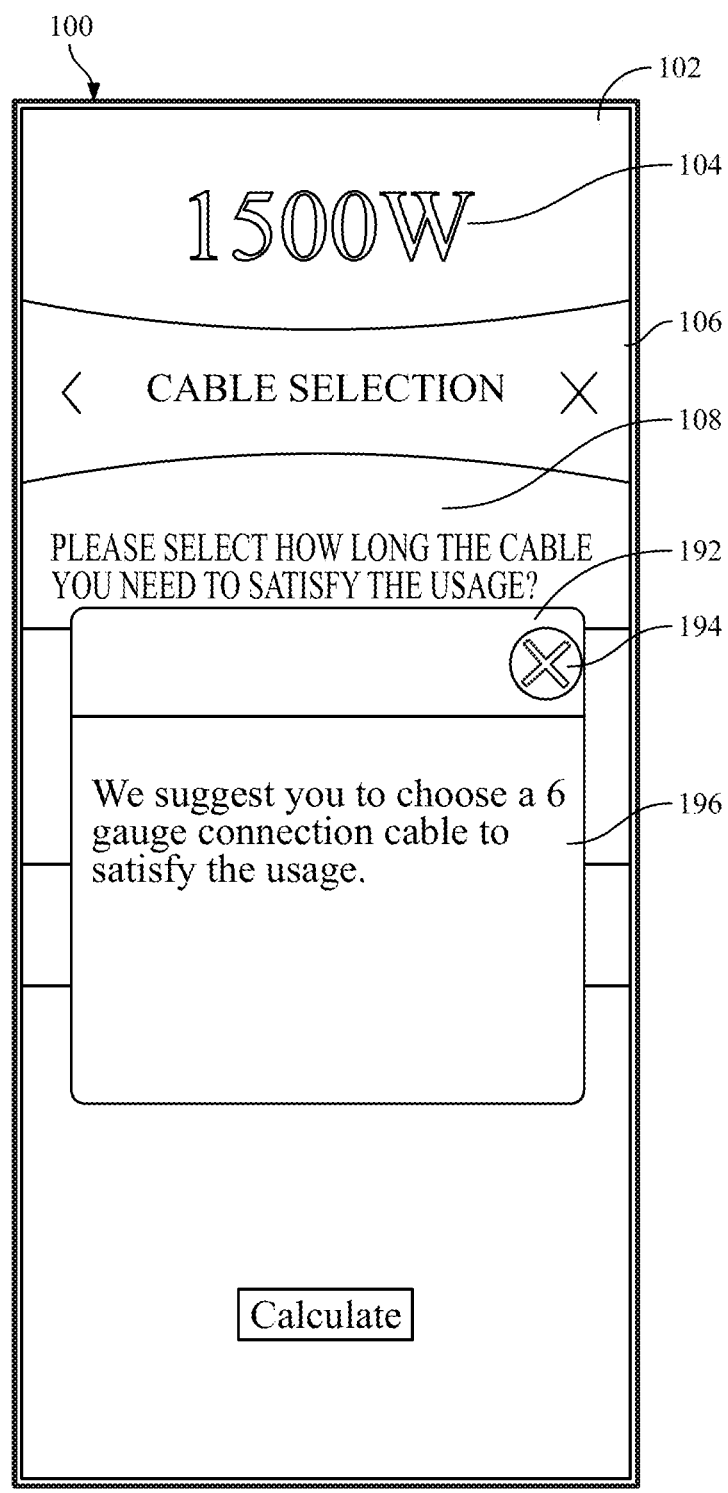

FIG. 11 shows an exemplary cable gauge result screen of the application. As shown in FIG. 11, upon completing the cable gauge calculation, the application might display a suggested cable gauge to employ in a popup window 192 having a results display area 196 and a close button 194.

Figure 12:
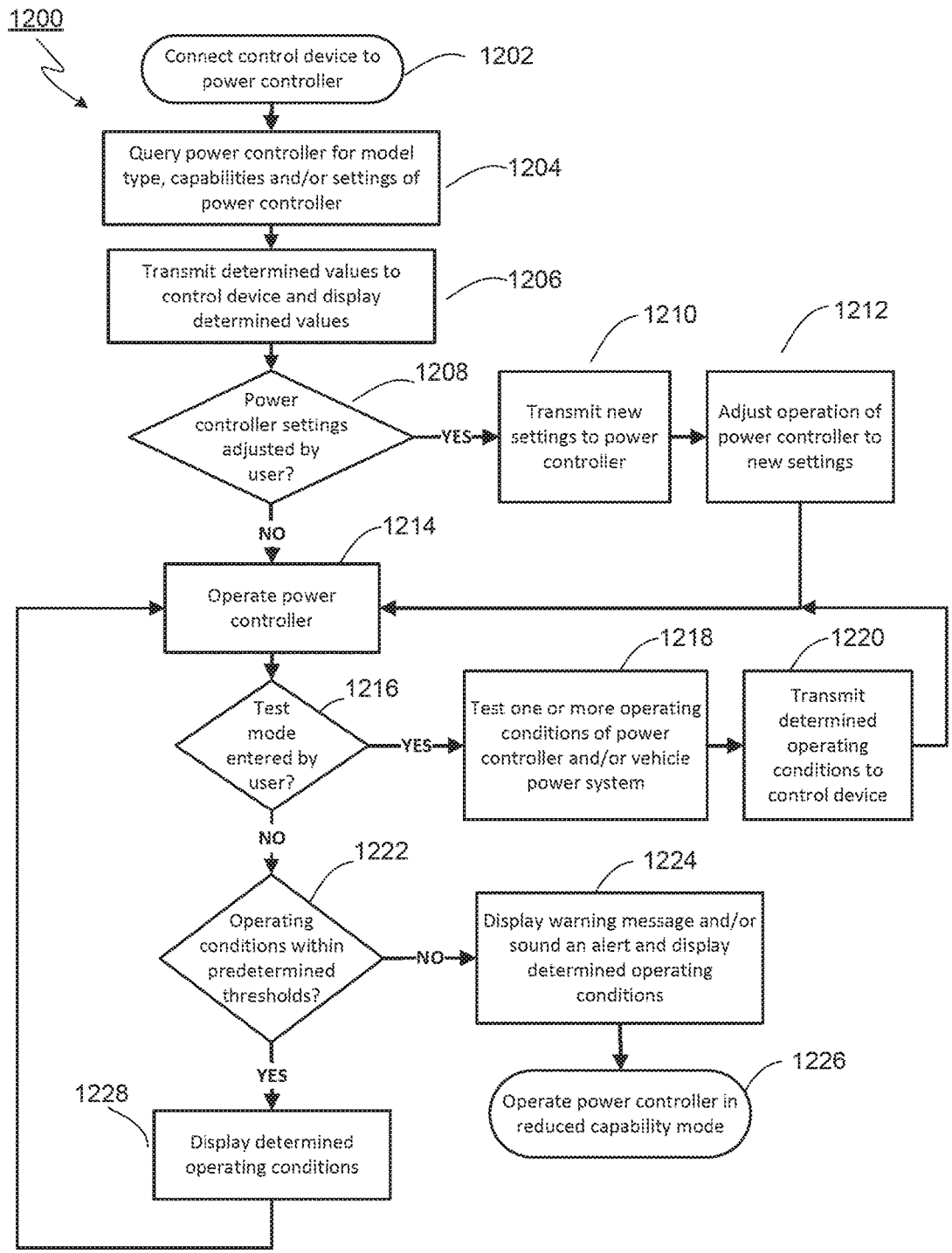
FIG. 12 is a flow diagram showing a method for operating the remote vehicle power control and monitoring system in accordance with described embodiments.

FIG. 12 is a flow diagram showing method 1200 for operating power inverter 12. As shown in FIG. 12, at step 1202, a given remote device 34 is connected, via a wired or wireless communication link, to power inverter 12, for example as selected via the application as described in regard to FIG. 3. At step 1204, the application requests operating parameters from the connected power inverter, for example, the model number or type of the power inverter, the currently set operating parameters of the power inverter (e.g., threshold and alarm settings, etc.), and the current operating conditions of the power inverter (e.g., current temperature, voltage, output power, etc.). At step 1206, power inverter 12 transmits the requested data to the application and remote device 34. For example, in a preferred embodiment, power inverter 12 might be in communication with remote device 34 via a personal area network (PAN), for example, an IEEE 802.15 PAN such as a Bluetooth® network. At step 1208, the application determines whether the user adjusted any settings of power inverter 12, for example by modifying any of the menu items or values such as described in regard to FIGS. 2-11. If, at step 1208, the user has modified one or more settings of power inverter 12, then at step 1210, remote device 34 transmits the updated settings to power inverter 12. At step 1212, power inverter 12 adjusts its operation in accordance with the updated settings and method 1200 continues to step 1214. If, at step 1208, the user has not modified any settings of power inverter 12, method 1200 continues to step 1214. At step 1214, power inverter 12 operates in accordance to its settings.

At step 1216, if the user has entered into a test mode via the application running on remote device 34 (e.g., as described in regard to FIGS. 6-7), then at step 1218 power inverter 12 performs one or more tests of the power inverter operation and/or of the vehicle power system operation, for example the voltage of vehicle battery 26, or whether the vehicle alternator is properly recharging battery 26. At step 1220, the results of the test(s) of the power inverter or vehicle power system operation are transmitted to remote device 34 and displayed in the application. If, at step 1216, the user has not entered into a test mode, the at step 1222, power inverter 12 determines whether all of its operating conditions are within the operating thresholds, for example the thresholds set by the user as described in regard to FIGS. 8-9, or within predefined thresholds set by the manufacturer of power inverter 12. If all the operating conditions are within the thresholds, then at step 1228 the operating conditions are transmitted to remote device 34 and displayed on the application and power inverter 12 continues normal operation at step 1214. If, however, at step 1222 one or more operating conditions are not within the thresholds, then at step 1224 power inverter 12 and/or remote device 34 provide a warning to the user indicating the irregular operating condition(s). Further, at step 1226, power inverter 12 might enter into a reduced (or disabled) operating mode. The reduced operation mode will be described in greater detail in regard to FIG. 17.

Figure 13:
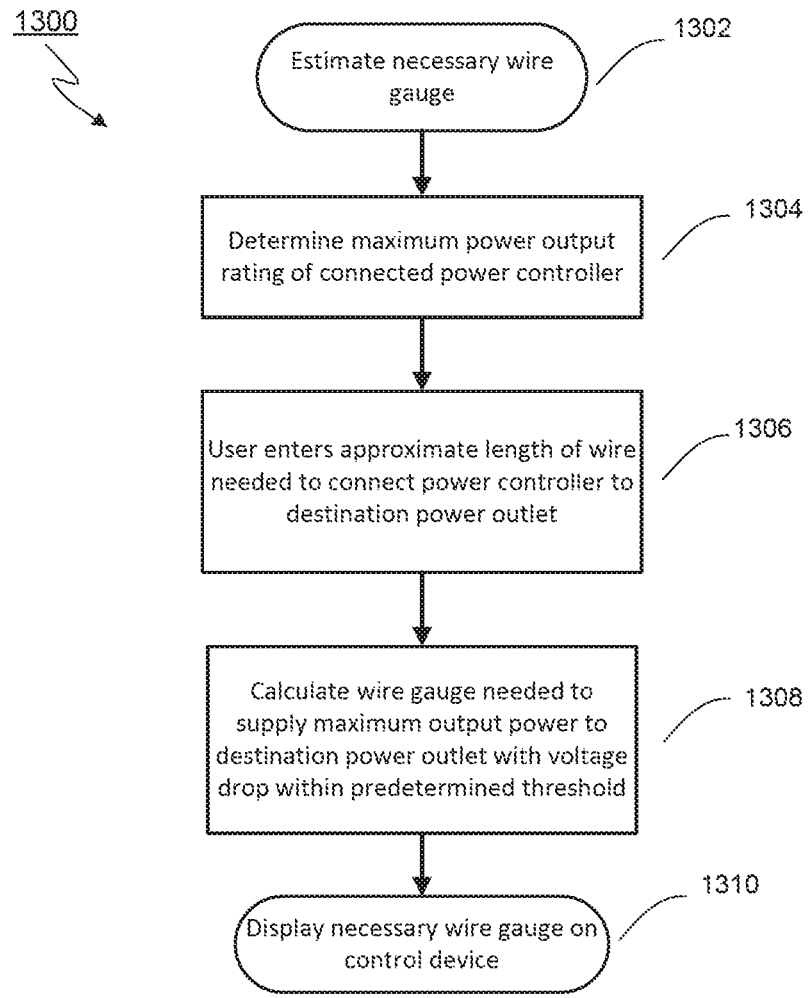
FIG. 13 is a flow diagram showing a method for automatically determining a gauge of wire needed to connect one or more devices to the remote vehicle power control and monitoring system in accordance with described embodiments.

FIG. 13 is a flow diagram showing method 1300 for automatically determining a gauge of wire needed to connect one or more devices to power inverter 12 such as described in regard to FIGS. 10-11. At step 1302, the user has entered into the wire gauge estimation utility of the application running on remote device 34. At step 1304, the user enters the power rating of the desired device (e.g., 36) to be connected to power inverter 12. At step 1306, the user enters in the approximate length of the cable needed to reach the desired device to be powered. At step 1308, the application, via remote device 34, determines an appropriate wire gauge that is capable of supplying the necessary output power over the estimated distance while maintaining the voltage drop of the supplied power within a predefined tolerance threshold. At step 1310, the determined wire gauge is displayed on the application and the wire gauge estimation utility completes.

Figure 14:
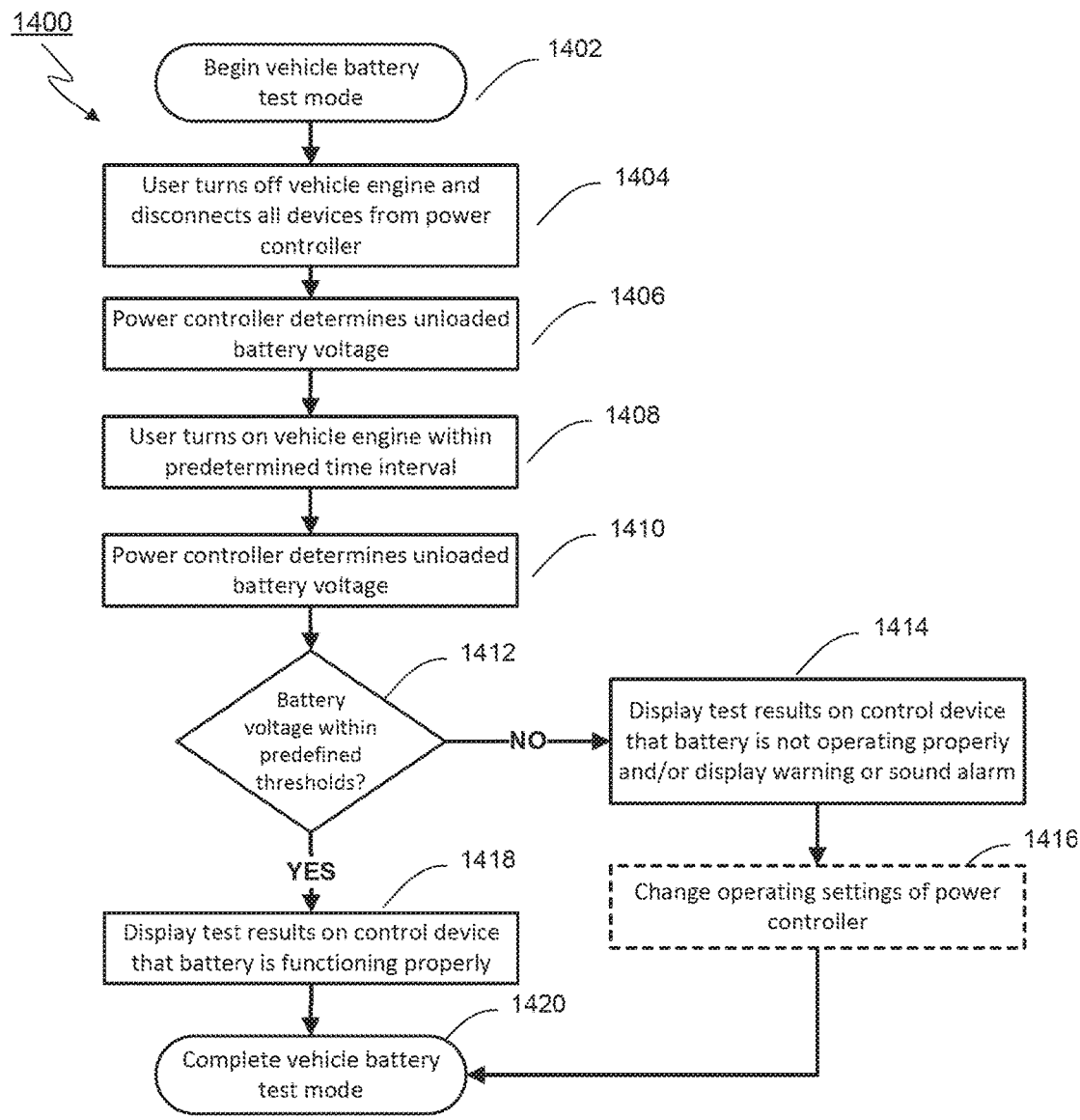
FIG. 14 is a flow diagram showing a method for the remote vehicle power control and monitoring system to test the vehicle battery in accordance with described embodiments.

FIG. 14 is a flow diagram showing method 1400 for power inverter 12 to test vehicle battery 26. As shown in FIG. 14, at step 1402, the user has entered into the vehicle battery test mode, for example as described in regard to FIGS. 6-7. At step 1404, the application prompts the user to turn off the vehicle engine and disconnect all devices 34 from power inverter 12. At step 1406, power inverter 12 measures the voltage of vehicle battery 26 with no connected load (e.g., no or minimal current draw from vehicle battery 26). At step 1408, the application prompts the user to turn on the vehicle engine within a predetermined time interval. In exemplary embodiments, the predetermined time interval might be 10 seconds. At step 1410, power inverter 12 measures the voltage of vehicle battery 26 with the vehicle engine running but battery 26 still unloaded. At step 1412, if the battery voltages determined at steps 1406 and 1410 are within predetermined thresholds, then at step 1418 the test results are displayed by the application to indicate proper functioning (e.g., charge holding capacity) of vehicle battery 26. If, at step 1412, the battery voltages determined at steps 1406 and 1410 are not within predetermined thresholds, then at step 1414 the test results are displayed by the application to indicate improper functioning (e.g., charge holding capacity) of vehicle battery 26 and an alarm might be displayed or sounded by power inverter 12 and/or remote device 34. At step 1416, power inverter 12 might optionally change its operating parameters based on the improper function of vehicle battery 26. For example, if battery 26 cannot hold a charge, power inverter 12 might disable its power outputs to prevent fully draining battery 26 or damaging battery 26, power inverter 12 or any devices 34 coupled to power inverter 12. At step 1420, method 1400 completes.

Figure 15:
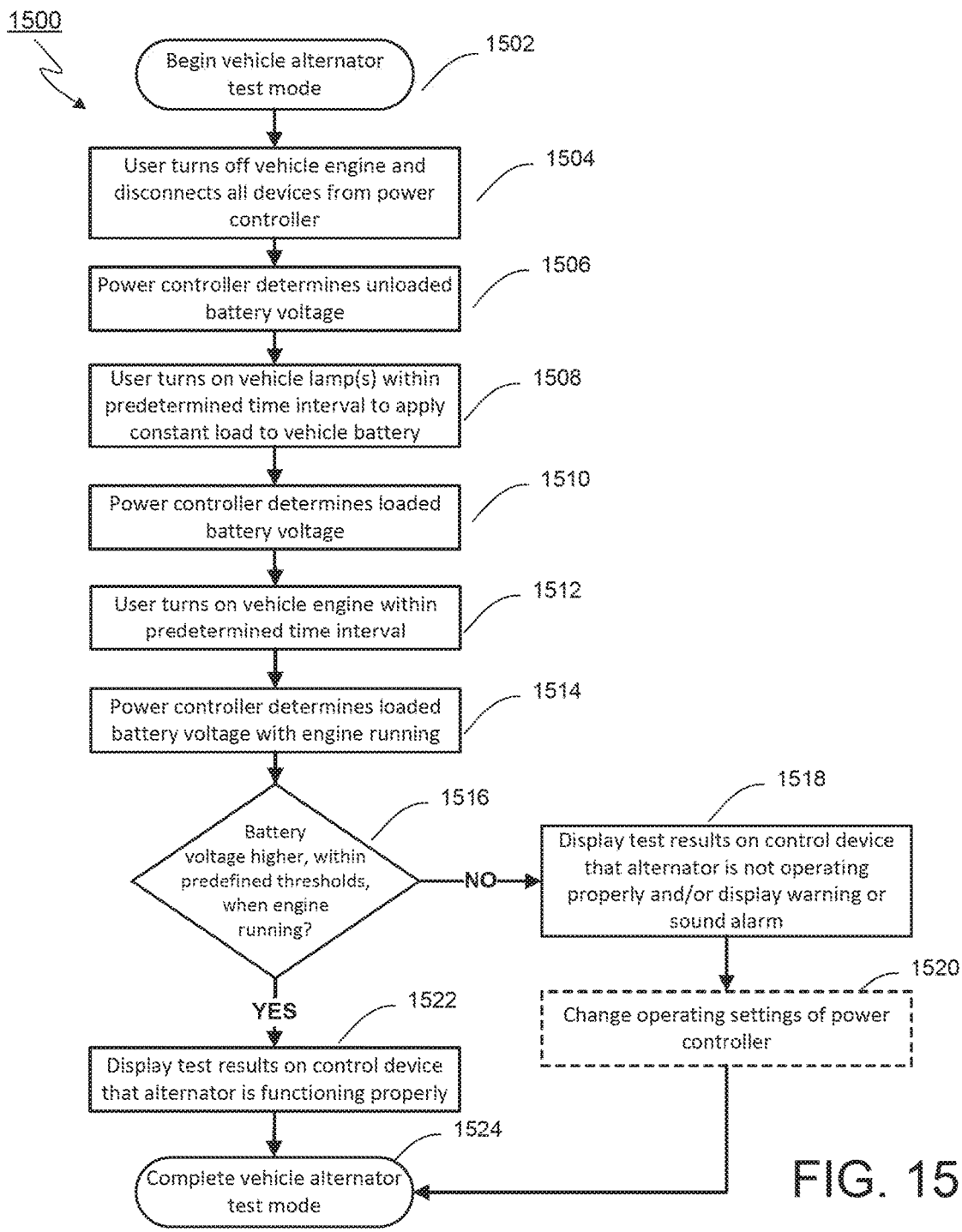
FIG. 15 is a flow diagram showing a method for the remote vehicle power control and monitoring system to test the vehicle alternator in accordance with described embodiments.

FIG. 15 is a flow diagram showing method 1500 for power inverter 12 to test the vehicle alternator. As shown in FIG. 15, at step 1502, the user has entered into the vehicle alternator test mode, for example as described in regard to FIGS. 6-7. At step 1504, the application prompts the user to turn off the vehicle engine and disconnect all devices 34 from power inverter 12. At step 1506, power inverter 12 measures the voltage of vehicle battery 26 with no connected load (e.g., no or minimal current draw from vehicle battery 26). At step 1508, the user turns on one or more vehicle lamps to apply a constant load to vehicle battery 26. At step 1510, power inverter 12 determines the loaded voltage of vehicle battery 26. At step 1512, the application prompts the user to turn on the vehicle engine within a predetermined time interval. In exemplary embodiments, the predetermined time interval might be 10 seconds. At step 1514, power inverter 12 measures the loaded voltage of vehicle battery 26 with the vehicle engine running. At step 1516, if the battery voltage determined at step 1514 (e.g., engine running) is higher than the voltages determined at steps 1506 and 1510 within a predetermined range, then at step 1522 the test results are displayed by the application to indicate proper functioning (e.g., battery charging) of the vehicle alternator. If, at step 1516, the battery voltage determined at step 1514 (e.g., engine running) is lower than the voltages determined at steps 1506 and 1510, then at step 1518 the test results are displayed by the application to indicate improper functioning (e.g., battery charging) of the vehicle alternator and an alarm might be displayed or sounded by power inverter 12 and/or remote device 34. At step 1520, power inverter 12 might optionally change its operating parameters based on the improper function of the vehicle alternator. For example, if battery 26 cannot be recharged, power inverter 12 might disable its power outputs to prevent fully draining battery 26 or damaging battery 26, power inverter 12 or any devices 34 coupled to power inverter 12. At step 1524, method 1500 completes.

Figure 16:
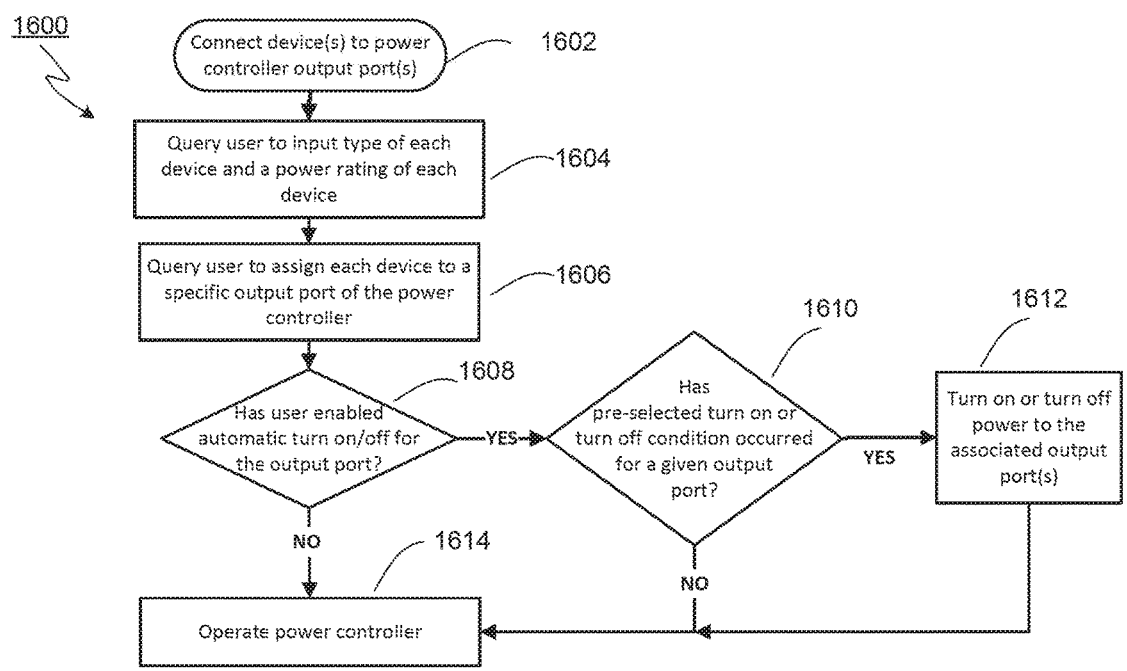
FIG. 16 is a flow diagram showing a method for the remote vehicle power control and monitoring system to automatically turn on or off connected devices in accordance with described embodiments.

FIG. 16 is a flow diagram showing method 1600 for power inverter 12 automatically turning on or off one or more connected devices 34. At step 1602, the user connects one or more devices to power inverter 12. In some embodiments, each output port or power outlet of power inverter 12 might be uniquely labeled, numbered or otherwise uniquely identified. At step 1604, the application running on remote device 34 might prompt the user to input a type of device connected to each output port or power outlet (e.g., "coffee maker", "TV", "laptop", etc.). The application might also ask the user to enter the power rating of each device, for example to facilitate wire gauge estimation as described in regard to FIG. 13. At step 1606 the application requests that the user assign each powered device to a given one of the output ports or power outlets of power inverter 12. At step 1608, the application determines whether the user has enabled or set an automatic turn on or automatic turn off even for one or more of the output ports or power outlets, for example as described in regard to FIG. 8. For example, the user might desirably set power inverter 12 to automatically turn off power to an output port powering a television at a certain time of day, after a period of time elapses, or based on the proximity of remote device 34 to power inverter 12, since if the user (e.g., remote device 34) is not near the power inverter, it might be presumed that certain devices, such as a TV, do not need power. In some embodiments, proximity might be estimated based upon wireless signal strength of communication link 32 between remote device 34 and power inverter 12. Alternatively, a lack of a connection, or acknowledgements, between remote device 34 and power inverter 12 might indicate a lack of proximity. In other embodiments, proximity might be estimated based upon a location of remote device 34 and a location of power inverter 12, for example as determined by use of the Global Positioning System (GPS). Alternatively, the user might desirably set certain devices to turn on based on the user's proximity, such as a space heater, radio or TV. Other devices or output ports might be configured to automatically turn on or off based on motion of the vehicle. Further, the user might set one or more output ports of power inverter 12 to automatically turn on or off based on time of day, for example by automatically turning on power to a coffee maker at a predetermined morning hour, or automatically turning off the power to a TV at a predetermined evening hour. At step 1610, power inverter 12 determines whether the preset automatic turn on or turn off event has occurred and, if so, at step 1612, turns on or off power, as appropriate for the given automatic event, to one or more output ports associated with the automatic event. If, at steps 1608 or 1610 either automatic turn on or off is not enabled, or an automatic event has not occurred, then power inverter 12 operates normally at step 1614 until the user enables automatic events and an automatic event occurs.

Figure 17:
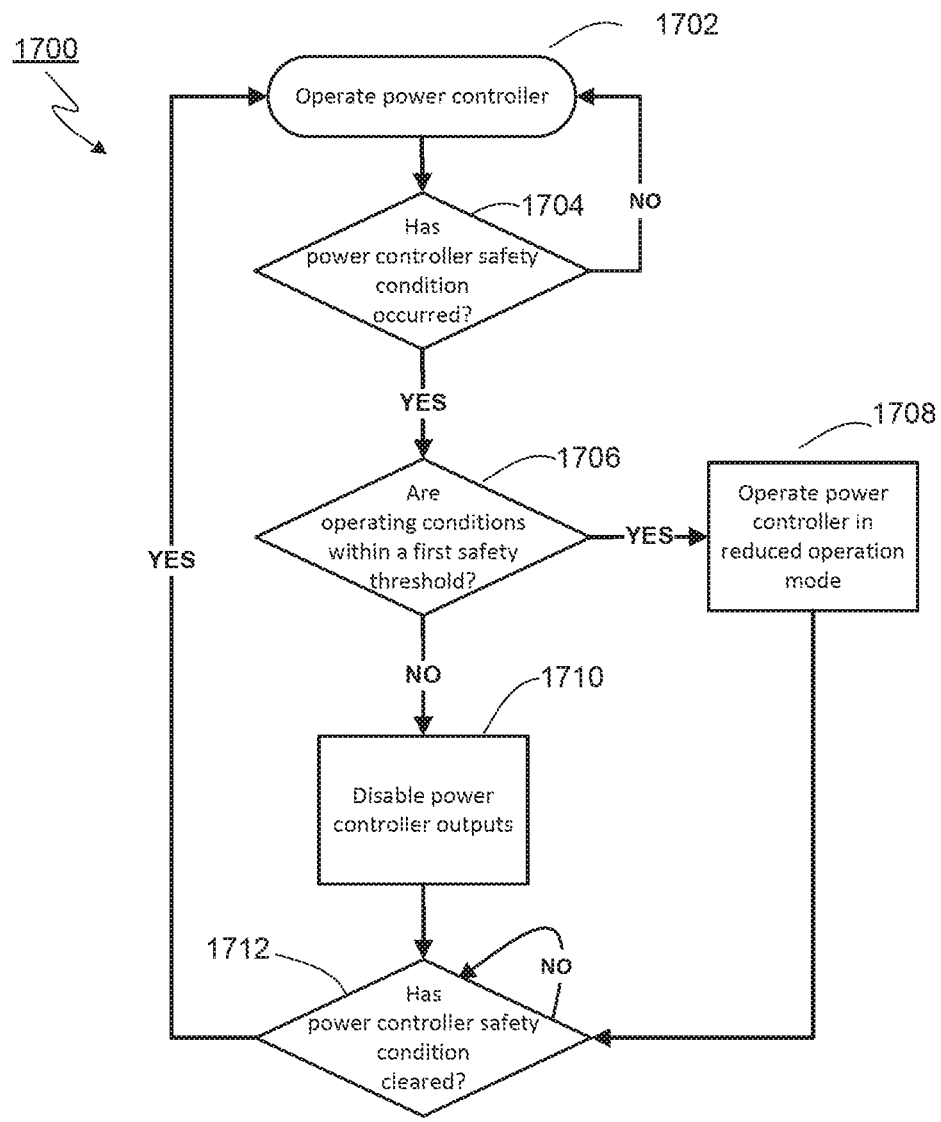
FIG. 17 is a flow diagram showing a method for controlling the safe operation of the remote vehicle power control and monitoring system in accordance with described embodiments.

FIG. 17 is a flow diagram showing method 1700 for maintaining operation of power inverter 12 within predefined safety limits. At step 1702, power inverter 12 operates normally. At step 1704, if a safety condition has occurred, then at step 1706 power inverter 12 determines whether the operating conditions are within a first safety threshold. In described embodiments, a safety condition might include an input voltage overvoltage condition, and input voltage undervoltage condition, an output voltage overvoltage condition, and input voltage undervoltage condition, an output current overcurrent condition, an output power overpower condition, an overtemperature condition, an overhumidity condition, or other similar operating characteristics of power inverter 12. If, at step 1706 the given operating condition is within a first threshold, then at step 1708, power inverter 12 might operate in a reduced output capability mode. For example, if the temperature of power inverter 12 is higher than a threshold, but not high enough to be a safety hazard, a warning might be generated (e.g., a visible or audible warning via power inverter 12 and/or remote device 34) and the total output capacity of power inverter 12 might be temporarily reduced (e.g., by disabling one or more, but not all, output ports, but power or current limiting one or more of the output ports, etc.). At step 1712, if by operating in the reduced output capacity mode the safety condition has cleared (e.g., the temperature of power inverter 12 has reduced below the first threshold) then method 1700 returns to step 1702 where power inverter 12 operates normally. If, at step 1706 the given operating condition is not within a first threshold, then at step 1710, power inverter 12 disable its power output. For example, if the temperature of power inverter 12 is high enough to be a safety hazard, a warning might be generated (e.g., a visible or audible warning via power inverter 12 and/or remote device 34) and all of the output ports of power inverter 12 might be disabled. At step 1712, if by disabling power inverter 12 the safety condition has cleared (e.g., the temperature of power inverter 12 has reduced below the first threshold) then method 1700 returns to step 1702 where power inverter 12 operates normally.

In further embodiments, power inverter 12 might include a connection or communication link to the vehicle electronic control unit(s) (ECUs), to allow communication of further vehicle diagnostic data to remote device 34. In particular, some embodiments might desirably allow communication of vehicle electrical system data or telematics data to remote device 34.

In some embodiments, power inverter 12 might be used by drivers of commercial vehicles, and thus remote device 34 might incorporate special features for commercial drivers, such as, based on the motion of the vehicle, time of day, and/or use of one or more output ports of power inverter 12, might prompt the user to fill in their hours of service logbook.

Although described herein as being an integral part of power inverter 12, in some embodiments, I/O interface 16 and antenna 14 might be an external add-on module connected to power inverter 12. For example, an external add-on module might be retrofitted onto older power inverters by being plugged into a USB connection of the older power inverter to receive power and communicate with the power inverter.

Thus, described embodiments provide a portable power inverter for generating alternating current (AC) power from a direct current (DC) power source. The power inverter includes a removably attachable input in electrical communication with the DC power source and an output configured to provide power to external devices. An inverter converts the input DC power to AC power and provides the AC power to at least one of the outputs. A measurement unit detects operating conditions of the power inverter and a communication link transmits the detected operating conditions to a remote device. A controller in electrical communication with the measurement unit, the communication link, and the inverter, controls operation of the portable power inverter.

It is understood that the herein described systems and methods are susceptible to various modifications and alternative constructions. There is no intention to limit the herein described systems and methods to the specific constructions described herein. On the contrary, the herein described systems and methods are intended to cover all modifications, alternative constructions, and equivalents falling within the scope and spirit of the herein described systems and methods.

It should also be noted that the herein described systems and methods can be implemented in a variety of electronic environments (including both non-wireless and wireless computer environments and including cell phones and other mobile devices), partial computing environments, cloud computing environments, and real world environments. The various techniques described herein may be implemented in hardware or software, or a combination of both. Programs used by the exemplary computing hardware might be implemented in various programming languages, including high level procedural or object oriented programming language and lower-level assembly or machine language. To the extent that the exemplary embodiments have been described with respect to processing blocks in a software program, including possible implementation as a digital signal processor, microcontroller, or general-purpose computer, the described embodiments are not so limited. As would be apparent to one skilled in the art, various functions of software might also be implemented as processes of circuits. Such circuits might be employed in, for example, a single integrated circuit, a multi-chip module, a single card, or a multi-card circuit pack.

The described embodiments might be embodied in the form of methods and apparatuses for practicing those methods. The described embodiments might also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The described embodiments might also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The described embodiments might also be embodied in the form of a bitstream or other sequence of signal values electrically or optically transmitted through a medium, stored magnetic-field variations in a magnetic recording medium, etc., generated using a method and/or an apparatus as described herein.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various described embodiments.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard. Unless explicitly stated otherwise, each numerical value and range should be interpreted as being approximate as if the word "about" or "approximately" preceded the value of the value or range. Signals and corresponding nodes or ports might be referred to by the same name and are interchangeable for purposes here.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts that have been described and illustrated herein might be made by those skilled in the art without departing from the scope of the following claims.

The invention claimed is:

1. A portable power inverter for connection to a direct current (DC) power source, the power inverter comprising:
   at least one input operationally configured to connect to the DC power source;
   at least one output, the at least one output including an AC outlet;
   an inverter operationally configured to convert the DC power source to AC power and provide the AC power to the AC outlet;
   a measurement unit configured to detect at least one operating condition of the power inverter;
   a communication link configured to transmit the one or more detected operating conditions to a remote device;
   a controller in electrical communication with the measurement unit, the communication link, and the inverter, the controller operationally configured to control operation of the inverter; wherein the power inverter is operationally configured to perform an operation test of the DC power source;
   wherein the DC power source is coupled to a recharging device; and
   wherein the operation test of the DC power source comprises testing the recharging device based on an unloaded voltage of the DC power source when the recharging device is not operating, a loaded voltage of the DC power source when the recharging device is not operating, and a loaded voltage of the DC power source when the recharging device is operating, the voltage measurements taken in a predetermined elapsed time period.

2. The power inverter of claim 1, wherein the communication link is a wireless network.

3. The power inverter of claim 1, wherein the measurement unit comprises at least one sensor, each of the at least one sensor configured to measure at least one operating characteristic of the power inverter.

4. The power inverter of claim 1, wherein the at least one operating condition comprises at least one selected from the group of: a voltage of the at least one input, a current of the at least one input, a voltage of each of the at least one output, a current of each of the at least one output, and an internal temperature of the power inverter.

5. The power inverter of claim 4, wherein the AC power provided to at least one of the AC outlet is a 120 VAC outlet and the DC power source is a 12 VDC power source.

6. The power inverter of claim 4, wherein the at least one input operationally configured to connect to the DC power source is a cigarette lighter adapter.

7. The power inverter of claim 1, wherein the DC power source is a vehicle battery and the recharging device is an alternator coupled to a motor of the vehicle.

8. The power inverter of claim 1, wherein the operation test of the DC power source comprises measuring a voltage of the DC power source.

9. The power inverter of claim 1, wherein the controller is operationally configured to:
   operate the at least one output in a normal mode when each of the at least one measured operating characteristics are within a first set of thresholds;
   operate in a reduced output mode when at least one of the at least one measured operating characteristics is not within the first set of thresholds but is within a second set of thresholds and none of the at least one measured operating characteristics is not within the second set of thresholds; and
   operate in an output disable mode disable operation when at least one of the at least one measured operating characteristics is not within the second set of thresholds.

10. The power inverter of claim 9, wherein the power inverter is operationally configured to generate an alarm to the remote device when either the first set of thresholds or the second set of thresholds is exceeded.

11. The power inverter of claim 1, wherein the power inverter is operationally configured to provide power to each of the at least one outputs automatically based upon at least one event condition.

12. The power inverter of claim 11, wherein the event condition comprises at least one of: a time of day, an elapsed time, a proximity of the remote device to the power inverter, a temperature of the power inverter, and a detected motion of the power inverter.

13. The power inverter of claim 1, wherein the at least one output further comprises at least one DC power output.

14. The power inverter of claim 13, wherein the at least one DC power output comprises at least one selected from the group of: a 5 VDC universal serial bus (USB) output and a 12 VDC output.

15. The power inverter of claim 1, wherein the communication link is configured to receive operating settings of the power inverter from the remote device.

16. The power inverter of claim 1, wherein the remote device is configured to generate an estimated wire gauge required to supply power from each of the at least one outputs, the estimated wire gauge determined based upon an approximate length of wire from each of the at least one outputs to a corresponding one of the at least one devices, a power rating of the corresponding one of the at least one devices, and a voltage drop threshold.

17. The power inverter of claim 1, wherein the power inverter is operationally configured to receive commands from the remote device to alter at least one operating parameter of the power inverter.

\* \* \* \* \*